United States Patent [19]
Hanoka

[11] Patent Number: 6,114,046
[45] Date of Patent: *Sep. 5, 2000

[54] ENCAPSULANT MATERIAL FOR SOLAR CELL MODULE AND LAMINATED GLASS APPLICATIONS

[75] Inventor: Jack I. Hanoka, Brookline, Mass.

[73] Assignee: Evergreen Solar, Inc., Waltham, Mass.

[ * ] Notice: This patent issued on a continued prosecution application filed under 37 CFR 1.53(d), and is subject to the twenty year patent term provisions of 35 U.S.C. 154(a)(2).

[21] Appl. No.: 08/899,512

[22] Filed: Jul. 24, 1997

[51] Int. Cl.$^7$ .......................... B32B 27/08; B32B 17/10; H01L 31/048
[52] U.S. Cl. .......................... 428/515; 428/441; 136/251; 156/99
[58] Field of Search .................................. 428/441, 515; 136/251; 159/99

[56] References Cited

U.S. PATENT DOCUMENTS

| | | | |
|---|---|---|---|
| 3,261,074 | 7/1966 | Beauzee | 29/25.3 |
| 3,502,507 | 3/1970 | Mann | 136/89 |
| 3,903,427 | 9/1975 | Pack | 250/578 |
| 3,903,428 | 9/1975 | DeJong | 250/578 |
| 3,990,100 | 11/1976 | Mamine et al. | 357/30 |
| 4,133,697 | 1/1979 | Frosch et al. | 136/245 |
| 4,135,290 | 1/1979 | Evans | 437/2 |
| 4,148,972 | 4/1979 | Yamane et al. | 428/515 |
| 4,173,820 | 11/1979 | Frosch et al. | 437/2 |
| 4,361,950 | 12/1982 | Amick | 437/2 |
| 4,415,607 | 11/1983 | Denes et al. | 427/96 |
| 4,415,780 | 11/1983 | Daugherty et al. | 200/5 A |
| 4,543,444 | 9/1985 | Rasch et al. | 136/256 |
| 4,610,077 | 9/1986 | Minahan et al. | 437/2 |
| 4,692,557 | 9/1987 | Samuelson et al. | 136/251 |
| 4,755,866 | 7/1988 | Marshall et al. | 357/81 |
| 4,849,028 | 7/1989 | Krause | 136/201 |
| 4,860,444 | 8/1989 | Herrell et al. | 29/840 |
| 4,897,123 | 1/1990 | Mitsui | 136/256 |
| 4,912,288 | 3/1990 | Atkinson et al. | 174/251 |

(List continued on next page.)

FOREIGN PATENT DOCUMENTS

| | | |
|---|---|---|
| 0 366 236 | 5/1990 | European Pat. Off. . |
| 0 680 097 | 11/1995 | European Pat. Off. . |
| 2515874 | 5/1983 | France . |
| WO 89 12911 | 6/1989 | WIPO . |

OTHER PUBLICATIONS

Chemical Abstracts Registry 66319–63–9, 1998.
Chemical Abstracts Registry 25608–26–8, 1998.
Chemical Abstracts DN 123:230647, 1995.
Technical Information Bulletin, by Philadelphia Decal, (1993), pp. 1–2.
"How to Use Decals in Decorating", Philadelphia Ceramics, Inc., pp. 1–4 (no date).
"The Making of a Decal", *The Plate Collector*, Dec. 1985, pp. 33–35.
Cavicchi et al., "Large Area Wraparound Cell Development", *IEEE*, 1984, pp. 128–133.
Michaels et al., "Large Area, Low Cost Space Solar Cells with Optional Wraparound Contacts", *IEEE*, 1981, pp. 225–227.

(List continued on next page.)

*Primary Examiner*—Bernard Codd
*Attorney, Agent, or Firm*—Testa, Hurwitz & Thibeault, LLP

[57] ABSTRACT

An encapsulant material includes a layer of metallocene polyethylene disposed between two layers of ionomer. More specifically, the layer of metallocene polyethylene is disposed adjacent a rear surface of the first ionomer layer, and a second layer of ionomer is disposed adjacent a rear surface of the layer of metallocene polyethylene. The encapsulant material can be used in solar cell module and laminated glass applications.

21 Claims, 2 Drawing Sheets

U.S. PATENT DOCUMENTS

| | | | |
|---|---|---|---|
| 4,966,631 | 10/1990 | Matlin et al. | 136/244 |
| 5,055,907 | 10/1991 | Jacobs | 357/71 |
| 5,108,541 | 4/1992 | Schneider et al. | 156/631 |
| 5,116,459 | 5/1992 | Kordus et al. | 156/631 |
| 5,118,362 | 6/1992 | St. Angelo et al. | 136/256 |
| 5,143,556 | 9/1992 | Matlin | 136/244 |
| 5,151,377 | 9/1992 | Hanoka et al. | 437/2 |
| 5,270,248 | 12/1993 | Rosenblum et al. | 437/160 |
| 5,425,816 | 6/1995 | Cavicchi et al. | 136/256 |
| 5,462,807 | 10/1995 | Halle et al. | 428/515 |
| 5,476,553 | 12/1995 | Hanoka et al. | 136/251 |
| 5,478,402 | 12/1995 | Hanoka | 136/251 |
| 5,620,904 | 4/1997 | Hanoka | 438/98 |
| 5,733,382 | 3/1998 | Hanoka . | |
| 5,859,137 | 1/1999 | Chou | 525/178 |

OTHER PUBLICATIONS

Mason et al., "Development of 2.7 mil BSF and BSFR Silicon Wrapthrough Solar Cells", *IEEE*, 1990, pp. 1378–1382.

Gee et al., "Emitter Wrap–Through Solar Cell", *IEEE*, 1993, pp. 265–270.

Thornhill, Final Report—Automated Fabrication of Back Surface Field Silicon Solar Cells with Screen Printed Wraparound Contacts, prepared for NASA, 1977, pp. 1–30.

Product Brochure for Formion® Formulated Ionomer, by A. Schulman Inc., Resins, pp. 1–3. (no date).

The Rotary Press, newsletter from Philadelphia Decal, vol. I, Issue No. 2, Sep. 1993, pp. 1–2.

Baker et al., "Introduction of Acrylate Copolymer Based Ionomer Resins for Packaging Applications", pp. 1–20. (no date).

Sauer et al., "Poly(methyl methacrylate) Based Ionomers. 1. Dynamic Mechanical Properties and Morphology," *Macromolecules*, 28:3953–3962 (1995).

Hara et al., "Solution Properties of Ionomers. 2. Simple Salt Effect," *Macromolecules*, 22:754–757 (1989).

Hara et al., "Fatigue Behavior of Ionomers. 3. Effect of Excess Neutralizing Agent on Sulfonated Polystyrene Ionomers," *Macromolecules*, 23:4964–4969 (1990).

Douglas et al., "Viscoelastic and Morphological Study of Ionic Aggregates in Ionomers and Ionomer Blends," *Macromolecules*, 44:4377–4352 (1994).

Tachino et al., "Structure and Properties of Ethylene Ionomers Neutralized with Binary Metal Cations," *Macromolecules*, 27:372–378 (1994).

ENCAPSULANT MATERIAL FOR SOLAR CELL MODULE AND LAMINATED GLASS APPLICATIONS

GOVERNMENT INTEREST

The subject matter described herein was supported in part by Photovoltaic Manufacturing Technology (PVMaT) Contract No. ZAP-5-14271-09.

FIELD OF THE INVENTION

The invention relates to encapsulant materials for various applications. More particularly, the invention relates to an encapsulant material for solar cell module and laminated glass applications.

BACKGROUND

Transparent encapsulant materials are used in numerous applications, including solar cell module and laminated glass applications. In solar cell applications, transparent encapsulants protect and seal the underlying solar cells without adversely affecting the optical properties of such underlying materials. In laminated glass applications, transparent encapsulants minimize any possible hazards from broken glass. In these applications, the encapsulant is exposed to the ultraviolet (UV) rays of the sun and this exposure can result in the yellowing and physical degradation of the polymer. To prevent this, UV stabilizers are added to the encapsulant.

In the manufacture of crystalline silicon solar cell modules, a transparent encapsulant material is used to protect the brittle silicon solar cells from breakage and to help seal these cells into the overall module structure. The encapsulant material is usually a thermoplastic. The thermoplastic is melted, then flows to fill in any open spaces in the module and bonds to all adjacent surfaces. The most widely used encapsulant material for solar cell modules is a copolymer of vinyl acetate and ethylene, known as ethylene vinyl acetate (EVA). EVA is used to encapsulate and seal both thin film and crystalline silicon solar cell modules.

There are several disadvantages associated with using EVA as an encapsulant material that adversely affect the quality and manufacturing cost of the solar cell modules. First, an organic peroxide is added to EVA in order to cross-link it using the heat which accompanies the lamination process. The cross-linking is necessary to increase the creep resistance of the encapsulated structure. However, the peroxide is not completely consumed during the cross-linking process, and the remaining peroxide can promote subsequent oxidation and degradation of EVA. In addition, the EVA must be laminated in a vacuum when making a module because of the presence of peroxide in the EVA. The reason for this is that oxygen lowers the degree of cross-linking, producing an unsatisfactory encapsulant. Second, the preferred EVA usually contains 33% (by weight) of vinyl acetate, and thus is a very soft and tacky substance that tends to stick to itself. This tackiness makes handling of the EVA material in a manufacturing environment much more troublesome. As such, the EVA material requires a release paper or liner material to use the material. Third, peroxide cured EVA has been known to turn yellow and brown under extensive exposure to sunlight for several years. Yellowing and browning causes reduction in solar module power output. Fourth, EVA can produce acetic acid under processing conditions which can then foster metal contact corrosion. Fifth, EVA is known to be fairly permeable to water and is, therefore, far from ideal as a sealant.

Although virtually any transparent polymer eventually shows some degradation and yellowing after exposure to sunlight, an encapsulant material that can withstand degradation and yellowing for a longer period of time than EVA is desirable. Ideally, a solar cell module should last for thirty years without showing much sign of degradation. EVA is unlikely to satisfy this thirty year duration requirement. In addition to finding a suitable replacement for EVA (or PVE, which is described below), it is also necessary to develop a suitable UV light stabilization package for the encapsulant.

In laminated glass applications, the laminated glass is made by forming a sandwich of two pieces of glass with a sheet of a transparent polymer disposed between the two pieces. This transparent polymer sheet serves to prevent the glass in the laminated structure from shattering into dangerous shards when the glass is broken. Windshields on automobiles and architectural glass are manufactured in this manner. Poly vinyl butyral (PVB) is a widely used material in such polymer sheets in the foregoing laminated glass applications. PVB, however, has several drawbacks. First, PVB is extremely hydroscopic (i.e. it absorbs moisture readily). Therefore, it must be kept refrigerated and maintained under special atmospheric conditions before it can be successfully laminated. Second, PVB is also extremely soft and tacky and, therefore, must be used with a release or liner layers.

SUMMARY OF THE INVENTION

This invention features an encapsulant material that may be used in solar cell modules, laminated glass and a variety of other applications. The encapsulant material is a three layer structure. A middle layer is formed of metallocene polyethylene and disposed between two outer layers of ionomer. The layer of metallocene polyethylene can comprise copolymers of ethylene with butene, hexene, or octene.

The ionomer layers can be derived from any direct or grafted ethylene copolymer of an alpha olefin having the formula R—CH=CH$_2$, where R is a radical selected from the class consisting of hydrogen and alkyl radicals having from 1 to 8 carbon atoms and alpha, beta-ethylenically unsaturated carboxylic acid having from 3 to 8 carbon atoms. The acid moieties are randomly or non randomly distributed in the polymer chain. The alpha olefin content of the copolymer can range from 50–92% while the unsaturated carboxylic acid content of the copolymer can range from about 2 to 25 mole percent, based on the alpha olefin-acid copolymer, and said acid copolymers having from 10 to 90 percent of the carboxylic acid groups ionized by neutralization with metal ions from any of the Group I, II, or III type metals.

The layers of metallocene polyethylene and ionomer are exceptionally transparent. In one detailed embodiment, the metallocene polyethylene layer is formed from a copolymer of ethylene and octene, and the ionomer layers are based on an ethylene methacrylic acid copolymer that has been partially neutralized as a sodium salt.

An encapsulant material which is a combination of these two materials allows for the exploitation of the best properties of each material while overcoming the limitations of either EVA laminates or of each material if used alone. The outer ionomer layers allow the encapsulant material to bond strongly to all the adjacent surfaces. The inner metallocene polyethylene layer which forms the bulk of the encapsulant material is a highly transparent, low cost thermoplastic material. The two ionomer layers are thin (i.e., the order of 0.001–0.004" thick), and are based on an ethylene methacrylic acid copolymer (such copolymer containing at least 10% (by wt.) of the carboxylic acid with at least 50% of the acid as "free" (un-neutralized acid). This level of acid content promotes strong adhesive bonds with the glass superstrate, the silicon cells, and the rear backing surface of the encapsulated system as well as exhibiting high light transmission. The metallocene polyethylene has excellent optical clarity and superior physical properties compared to the ionomer. These superior properties are derived from the fact that the metallocene catalyst used results in a polymer with narrow molecular weight distribution.

There are several advantages associated with an encapsulant material which is a combination of the metallocene polyethylene and ionomer materials. One of these advantages involves the bonding strength of the encapsulant with all adjacent surfaces. The bonding strength is qualitatively described by the method in which the bond failure occurs under test conditions. Adhesive bond failure describes the case in which the bond at the interface fails. Cohesive failure describes a much stronger bond, whereby the polymer material itself fails before the interface bond. I In this case, the interface bond is stronger than the internal bonding of the polymer (i.e., the encapsulant) itself. Because of their acid functionality, the outer ionomer layers will result in cohesive bond failure. The metallocene polyethylene, on the other hand, will only result in adhesive bond failure, as will EVA.

Another advantage associated with the encapsulant material relates to cost. The base resin for metallocene polyethylene is considerably lower in cost than that of ionomer. With a large percentage (e.g., 83%) of the encapsulant made up of the metallocene polyethylene, this reduces the cost of the three-layered encapsulant significantly over that of a single layer of ionomer of the same total thickness (e.g., 18 mils).

Also, because of its tight molecular weight distribution, metallocene polyethylene, used alone, would have a rather narrow melting range making the fabrication of sheet from this material problematic and creating difficulties in lamination.

In contrast to EVA and PVE, the encapsulant material of the present invention is not tacky and can be easily handled in a manufacturing environment without the need for any release paper. While ionomers are known to be slightly hydroscopic, the finished sheet of encapsulant material does not need special storage (which PVB does need) and does not need to be kept in sealed dark bags as required for EVA. The use of a material that includes both metallocene polyethylene and ionomer solves these problems and avoids the problems above-described associated with EVA and PVB.

The invention also features a solar cell module including the above-described encapsulant material. The module comprises at least one solar cell and the encapsulant material disposed adjacent to at least one surface of the solar cell. A front support layer is formed of the light transmitting material disposed adjacent a front surface of the encapsulant material, and a backskin layer disposed adjacent a rear surface of the encapsulant material. The front support layer and backskin layer are laminated to encapsulate and seal the solar cell from the ambient atmosphere.

The invention also features a laminated transparent member including the above-described encapsulant material. The member comprises a front support layer formed of transparent material, the transparent encapsulant layer and a rear support layer formed of transparent material. The transparent encapsulant layer is disposed adjacent a rear surface of the front support layer. The rear support layer is disposed adjacent a rear surface of the encapsulant layer. The front and rear support layers can be glass or plastic.

The invention also features a method of manufacturing an encapsulant material. The method includes the steps of: providing a sheet of metallocene polyethylene; placing a first layer of ionomer adjacent a front surface of the sheet of metallocene polyethylene; and placing a second layer of ionomer adjacent a rear surface of the sheet of metallocene polyethylene. The layers of ionomer can be bonded to the front and rear surfaces of the sheet of metallocene polyethylene. In one detailed embodiment, a three ply sheet of encapsulant material can be produced from any of several processes for coextrusion of thermoplastics.

The invention also features a method of manufacturing a solar cell module comprising the steps of: providing at least one solar cell; forming the above-described transparent encapsulant material; placing the encapsulant material adjacent at least one surface of the solar cell, preferably two; and positioning the solar cell and the encapsulant material between a transparent front support layer and a backskin layer.

The invention also features a method of manufacturing a laminated transparent member comprising the steps of: providing two transparent support layers; forming the above-described transparent encapsulant material; placing the encapsulant material between the two support layers to form an assembly; and laminating the assembly to encapsulate the support layers with the encapsulant layer.

DETAILED DESCRIPTION

Figure 1:
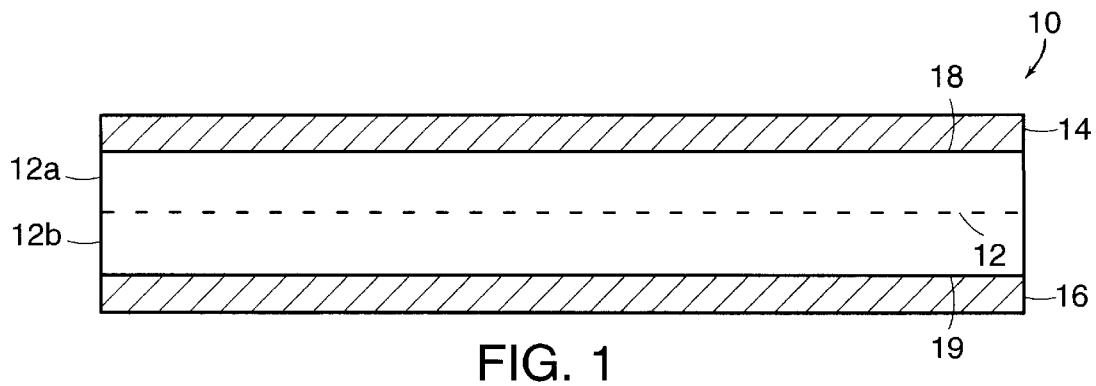
FIG. 1 is a cross-sectional view of an encapsulant material incorporating the principles of the invention.

FIG. 1 is a cross-sectional view of a transparent encapsulant material 10 incorporating the principles of the invention. In one embodiment, the encapsulant material 10 can be used in a solar cell module to protect crystalline silicon solar cells from breakage when they are in a module and subjected to mechanical stress during field usage. The encapsulant material also serves to seal the module, which is particularly important for thin film modules. In another embodiment, the encapsulant material 10 can be laminated between two pieces of glass or transparent polymer to provide a composite structure that does not shatter when broken.

The encapsulant material 10 comprises an inner layer 12 and outer layers 14 and 16. The outer layer 14 is disposed adjacent a front surface 18 of the inner layer, and the outer layer 18 is disposed adjacent a rear surface 20 of the inner layer. The inner layer 12 comprises a highly transparent thermoplastic material. The outer layers 14, 16 are made of transparent polymer material that is capable of heat bonding to various materials including glass, metals and other polymers.

In one embodiment, the inner layer 12 can be formed of metallocene polyethylene and the outer layers 14, 16 can be formed of an ionomer. Metallocene polyethylene is prepared by using as a catalyst an organometallic coordination compound which is obtained as a cyclopentadienyl derivative of a transition metal or a metal halide. The term "ionomer" refers to a generic class of polymers which contain both covalent bonds and regions of ionic bonding. In a detailed embodiment, the ionomer comprises a copolymer of ethylene and methacrylic acid, or acrylic acid, which has been neutralized with the addition of a salt which supplies a cation such as Li+, Na+, K+, Ca++, Zn++, Mg++, Al+++, or a copolymer of ethylene and a vinyl ester (i.e., ethylene methylmethacrylate copolymer to which cations such as those listed above have been added by saponification of the ester.

Adding 14% comonomer of octene to the metallocene polyethylene produces an inner layer 12 having excellent optical clarity. Moreover, the inner layer 14 has improved physical properties because the catalyst method used to prepare the material produces a polymer with a narrow molecular weight distribution. Polymers made with the usual catalysts tend to have significant components of lower molecular weights. The latter reduce the mechanical properties of the overall polymer, as compared with the higher molecular weight components of the polymer. Because a polymer made from a metallocene catalyst has a tighter molecular weight distribution and fewer lower molecular weight components, it exhibits greater mechanical strength and puncture resistance.

Although metallocene polyethylene has good optical properties, it bonds adhesively (no cohesive failures to most materials). Metallocene polyethylene is also difficult to process due to its narrow molecular weight distribution. A thermoplastic material with a narrow molecular weight distribution has a narrow melting range, making fabrication of a sheet of the material or lamination difficult. Providing outer layers 14, 16 formed of ionomer solves these problems.

In one embodiment, the outer layers 14, 16 are formed of an ionomer having a high acid content (i.e., at least 4% (by weight) free acid). The high acid content provides strong bonds (i.e., cohesive failures on delamination testing) and improves the optical properties of the ionomer. The metallocene polyethylene inner layer 14 comprises ethylene alpha-olefin with 14% comonomer of octene. This three layered structure displays interesting optical properties. When this encapsulant material is laminated under heat and pressure, it appears cloudy and light blue. However, when the total light transmission through the material is measured using an integrating sphere, it has been found that the total amount of light going through the material is over 90%. This is due to micro or nano crystalline size regions within the outer ionomer layers which scatter the incident light. The result of encapsulating a solar cell with the encapsulant of the invention is that there is no reduction in light reaching the cell as compared to an EVA encapsulated solar cell.

The following table indicates this result. The short circuit current density ($J_{sc}$ in mA/cm$^2$), which is a direct measure of the amount of light reaching the solar cell, was measured on solar cells without lamination and solar cells laminated with the encapsulant of the invention and with EVA under a piece of glass. The results indicate transmission at least as good as EVA and possibly even better.

| Sample # | Encapsulant | $J_{sc}$-bare cell | $J_{sc}$-post lamination | Δ (%) |
| --- | --- | --- | --- | --- |
| 1 | EVA | 28.23 | 26.89 | −4.7 |
| 2 | EVA | 28.52 | 27.20 | −4.6 |
| 4 | Invention | 28.55 | 27.45 | −3.8 |
| 5 | Invention | 28.46 | 27.36 | −3.9 |
| 6 | Invention | 27.02 | 26.20 | −3.0 |
| 7 | Invention | 27.30 | 26.43 | −3.2 |

The encapsulant material 10 can be formed by any number of film or sheet coextrusion processes, such as blown-film, modified blown-film, calendaring, and casting. In one embodiment, the encapsulant material 10 is formed by coextruding, in a blown film process, the metallocene polyethylene layer 12 and the ionomer layers 14, 16. In particular, the layer of metallocene polyethylene 12 includes first and second sublayers 12a, 12b of metallocene polyethylene. The first ionomer layer 14 is coextruded with the first sublayer 12a of metallocene polyethylene, and the second ionomer layer 16 is coextruded with the second sublayer 12b of metallocene polyethylene. The first layer 12a of metallocene polyethylene (along with the first ionomer layer 14) is then bonded to the second layer 12b of metallocene polyethylene (along with the second ionomer layer 16) to produce the encapsulant material 10. In this way, a thicker encapsulant layer and the desired 3-layer structure can be formed.

The ionomer layers 14, 16 can have a thickness in the range of 0.001–0.004 inch, and the layer 12 can be of any desired thickness. For solar cell applications, the layer 12 can have a thickness of approximately 0.015 inch such that the overall thickness of the encapsulant material 10 has a thickness of approximately 0.018 inch. The encapsulant material 10 can be manufactured as elongated sheet that can be stored in convenient rolls of any desired width.

Figure 2:
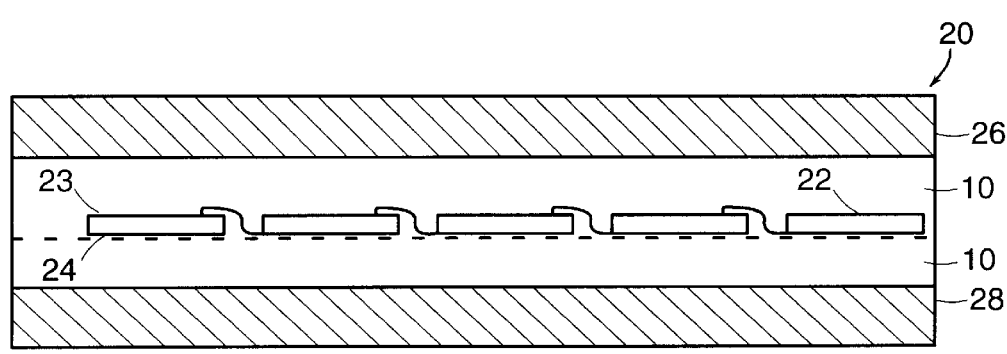
FIG. 2 is a cross-sectional view of a crystalline silicon solar cell module encapsulated with the encapsulant material of FIG. 1.

FIG. 2 is a cross-sectional view of a solar cell module 20 in which the encapsulant material 10 encapsulates interconnected crystalline silicon solar cells 22. The encapsulant material 10 is disposed adjacent the front 23 and rear surfaces 24 of the interconnected solar cells 22. The encapsulant material 10 adjacent the rear surfaces 24 of the interconnected solar cells 22 may be pigmented. The encapsulant material 10 may be bonded to the interconnected solar cells 22. A front support layer 26 formed of light transmitting material covers front surfaces 23 of the encapsulated interconnected solar cells 22. The front support layer 26 may be formed of glass or transparent polymer. A backskin layer 28 is disposed adjacent to the rear surfaces 24 of the encapsulated interconnected solar cells 22. The backskin layer 28 can be formed of (1) a polymer such as tedlar laminate, (2) a thermoplastic material that can be used to form edge sealing, thus eliminating the need for an aluminum frame, or (3) a piece of glass forming a double glass module. In one detailed embodiment, the backskin layer 28 can be a thermoplastic polyolefin comprising a mixture of at least two ionomers such as a sodium ionomer and a zinc ionomer with or without 10–20% (by weight) glass fiber.

Figure 3:
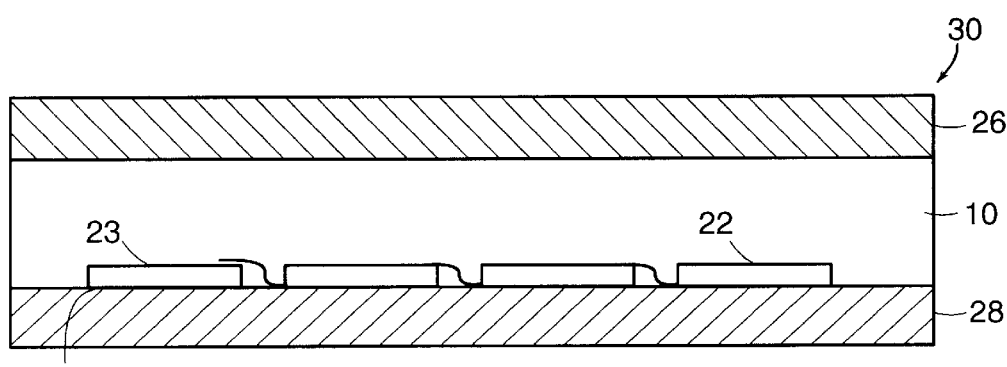
FIG. 3 is a cross-sectional view of a solar cell module in which the encapsulant material and a backskin encapsulates the solar cells.

FIG. 3 is a cross-sectional view of a solar cell module 30 in which the encapsulant material 10 and the backskin layer 28, in combination, encapsulate the interconnected solar cells 22. The encapsulant material 10 is disposed adjacent the front surfaces 23 but not the back surfaces of the interconnected solar cells 22. The encapsulant material need not be placed adjacent the rear surfaces 24 of the interconnected solar cells 22. The backskin layer 28 serves as the rear encapsulant and as the rear surface of the module.

Figure 4:
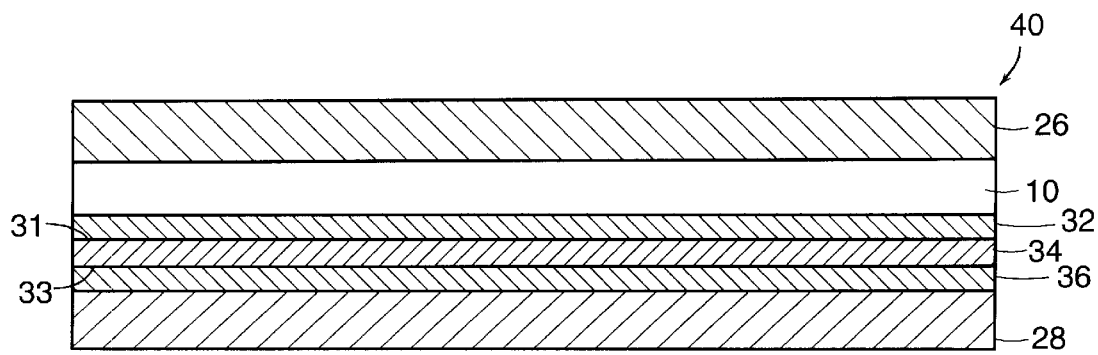
FIG. 4 is a cross-sectional view of a Copper Indium Diselenide thin film solar cell module which includes the encapsulant material.

FIG. 4 is a cross-sectional view of a solar cell module 40 which includes a thin film of Copper Indium Diselenide (CIS). A Zinc Oxide (ZnO) layer 32 is disposed on a front surface 31 of the Copper Indium Diselenide (CIS) film 34 and a back contact 36 is disposed on a rear surface 33 of the film 34. The encapsulant material 10 is disposed on the ZnO layer 32 and the front support layer 26 is disposed on the encapsulant material 10. The substrate layer 28, which can be formed of glass, plastic or metal, is disposed adjacent a rear surface of the back contact 36. For purposes of this invention, CIS is considered equivalent to the general class of I—III—VI$_2$ compounds such as the pentenary compound Cu(In,Ga)(Se,S)$_2$. Also, the transparent conducting layer (i.e., the ZnO layer) is considered the equivalent to the combination of the transparent conducting layer with a thin buffer layer (e.g., a 500 Å layer of CdS).

Figure 5:
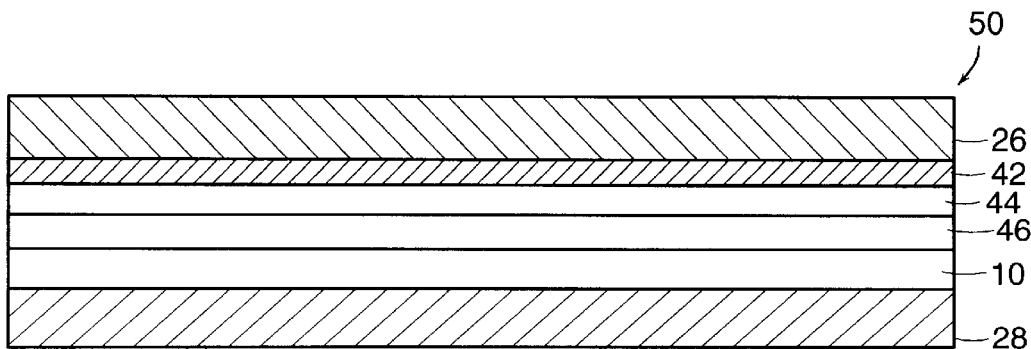
FIG. 5 is a cross-sectional view of an amorphous silicon solar cell module which includes the encapsulant material.

FIG. 5 shows a cross-sectional view of an amorphous silicon solar cell module 50 comprising the encapsulant material 10. A layer of thin transparent conducting oxide 42 (e.g., Tin Oxide (SnO$_2$)) is coated on a front support layer 26 comprising glass. An amorphous silicon layer 44 is disposed adjacent a rear surface of the oxide layer 42, and a rear contact 46 is disposed adjacent a rear surface of the amorphous silicon layer 44. The encapsulant material 10 is disposed adjacent a rear surface of the rear contact 46. The backskin layer 28, which can be formed of glass, plastic or metal, is disposed adjacent a rear surface of the encapsulant material 10. A front support layer comprising glass is disposed on the oxide layer 42.

Figure 6:
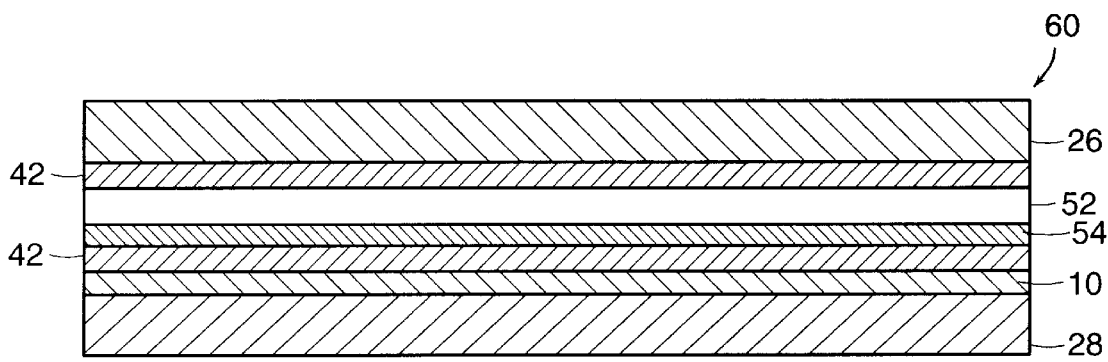
FIG. 6 is a cross-sectional view of a Cadmium Telluride thin film solar cell module which includes the encapsulant material.

FIG. 6 is a cross-sectional view of a Cadmium Telluride (CdTe) thin film module 60. A rear surface of the front support layer 26 is coated with a thin transparent conducting oxide layer 42. A layer of Cadmium Sulfide (CdS) 52 is placed adjacent to a rear surface of the oxide layer 42, and a layer of Cadmium Telluride (CdTe) 54 is placed adjacent a rear surface of the CdS layer 52. A rear contact 42 is placed adjacent a rear surface of the CdTe layer 54. The encapsulant material 10 is placed adjacent a rear surface of the rear contact 42, and a backskin layer 28 is disposed adjacent a rear surface of the encapsulant material 10.

Figure 7:
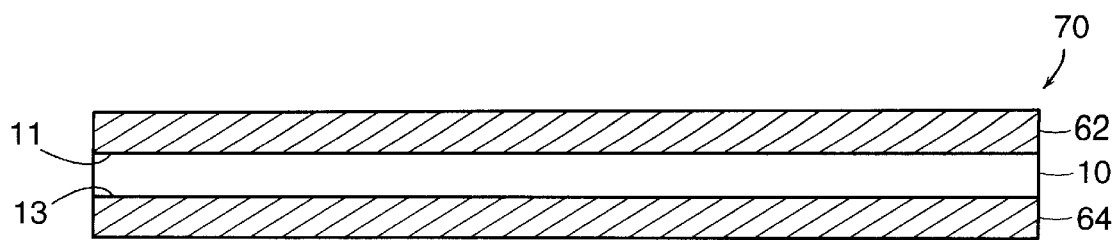
FIG. 7 is a cross-sectional view of a laminated glass structure which includes the encapsulant material.

FIG. 7 is a cross-sectional view of a laminated glass or transparent polymer assembly 70. A front support layer 62 formed of transparent material is disposed adjacent a front surface 11 of the encapsulant material 10 and a rear support layer 64 also formed of transparent material is disposed adjacent a rear surface 13 to the encapsulant material 10. The entire assembly 70 is then laminated to encapsulate the support layers 62, 64 with the encapsulant material 10.

The invention also features a UV stabilization additive package employed in the encapsulant material to prevent degradation. Photo-oxidation (oxidation caused by UV light) and thermal-oxidation (oxidation caused by heat) are two mechanism that cause degradation. By including a stabilization additive package, the encapsulant material has the ability to withstand degradation for an extended period of time. When used in solar cell modules, the encapsulant material has the capability to withstand degradation for up to a thirty year service life. When used in laminated glass or transparent polymer applications, the encapsulant material can last even longer, since the encapsulant has no exposure to oxygen or water vapors except at the edges of the laminated structure. If the edges are well sealed, the likelihood of any photo-oxidation taking place is very low.

The stabilization additive package must be appropriate for the applications in which the encapsulant material is to be used and must satisfy solubility limitations of the two materials used as the metallocene polyethylene layer 12 and the ionomer layers 14, 16 of the encapsulant material 10. A stabilization additive package has to be soluble in both materials up to the level desired. Otherwise, a concentration gradient and migration would occur. Metallocene polymers generally have lower solubility than ionomers, making the selection of stabilizers a non-trivial matter.

It has been determined that the stabilization additive package of the invention need not contain an ultraviolet light absorber (UVA) nor a phenolic anti-oxidant (AO). Since in both solar cell module and laminated glass applications, the glass filters a significant amount of the ultraviolet light from the sun, an ultraviolet light absorber is not needed. Furthermore, some ultraviolet light absorbers are known to result in yellowing themselves. It has also been determined that the stabilization system need not contain a phenolic AO, because the encapsulant material shows no significant loss of mechanical properties after repeated extrusions and again, phenolic AOs are known to result in yellowing themselves.

Based on the foregoing considerations, the ultraviolet stabilization additive package of the invention comprises a combination of hindered amine stabilizers. One hindered amine light stabilizer provides thermal oxidative and photo-oxidative stabilization and the second hindered amine light stabilizer provides mainly photo-oxidative stabilization.

In one embodiment, the stabilization additive package includes 0.1–0.25% hindered amine with a high order of protection against thermal oxidation and photo-oxidation and 0.25–1.0% of hindered amine with a high order of protection mainly against photo-oxidation. Ideally, one hindered amine would be preferred for both activities. However, a hindered amine that can perform both functions must also be sufficiently soluble in metallocene polyethylene and ionomer used in the encapsulant material, making this search difficult.

Examples of hindered amine stabilizers that provide thermal oxidative stabilization as well as photo-oxidative stabilization are 1,3,5-Triazine-2,4,6-triamine,N,N'''-[1,2-ethanediylbis [[[4,6-bis[butyl(1,2,2,6,6-pentamethyl-4-piperidiny)amino]-1,3,5-triazine-2-yl]imino]-3,1-propanediyl]]-bis[N',N''-dibutyl-N',N''-bis(1,2,2,6,6-pentamethyl-4-piperidinyl)-(Chimassorb 119, CAS Reg. No. 106990-43-6); N,N'-bis(2,2,6,6-Tetramethyl-4-piperidinyl)-1,6-hexanediamine, polymer with 2,4,6-trichloro-1,3,5-triazine and 2,4,4-trimethyl-1,2-pentamine (Chimassorb 944, ACS Reg. No. 70624-18-9); and N,N'-bis (2,2,6,6-Tetramethyl-4-piperidinyl)-1,6-hexanediamine polymer with 2,4,6-trichloro-1,3,5-triazine and tetrahydro-1,4-oxazine (Cyasorb UV 3346).

Examples of hindered amine stabilizers that provide photo-oxidative stabilization are dimethyl succinate polymer with 4-hydroxy-2,2,6,6-tetramethyl-1-piperidine ethanol (Tinuvin 622, CAS Reg. No. 65447-77-0); bis(2,2,6,6-tetramethyl-4-piperidinyl) sebacate (Tinuvin 770, ACS Reg. No. 52829-07-9); propandioic acid, [C4-(methoxyphenyl)-methylene]-, bis (1,2,2,6,6-pentamethyl-4-piperidinyl) ester, (CAS Registry No. 94274-03-0, Sanduvor PR-31); Poly-methylpropyl-3-oxy-[4(2,2,6,6-tetramethyl)piperidinyl] siloxane (Uvasil 299HM); and 3-Dodecyl-1-(2,2,6,6-tetramethyl-4-piperidinyl)-2,5-pyrrolidinedione (Cyasorb UV 3604).

In another embodiment, the hindered amine light stabilizers may be grafted onto a polymer structure. The Sanduvor PR-31 represents a new class of hindered amine light stabilizers which graft onto a polymer structure. Once a hindered amine light stabilizer is grafted onto a polymer, it remains in place as a stabilizer in the polymer.

Equivalents

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. An encapsulant material comprising:
   an outer layer of ionomer;
   an inner layer of metallocene polyethylene disposed adjacent a rear surface of the first layer; and
   a second outer layer of ionomer disposed adjacent a rear surface of the layer of metallocene polyethylene, wherein each of the first layer of ionomer and the second layer of ionomer have at least 4% free acid content by weight.

2. The encapsulant material of claim 1 wherein the first outer layer of ionomer and the second outer layer of ionomer are capable of adhering to an adjacent surface.

3. The encapsulant material of claim 1 wherein the inner layer of metallocene polyethylene comprises comonomer of hexene.

4. The encapsulant material of claim 1 wherein the inner layer of metallocene polyethylene comprises comonomer of butene.

5. The encapsulant material of claim 1 wherein the metallocene polyethylene is ethylene alpha-olefin comprising comonomer of octene.

6. The encapsulant material of claim 5 wherein the ionomer is a sodium ionomer comprising methacrylic acid.

7. The encapsulant material of claim 1 wherein the inner layer of metallocene polyethylene, the first and second layers of ionomer are substantially transparent.

8. The encapsulant material of claim 1 wherein the inner layer of metallocene polyethylene comprises two sublayers of metallocene polyethylene bonded together.

9. The encapsulant material of claim 1 wherein the first outer layer of ionomer and the second outer layer of ionomer each has a thickness in the range of 0.001–0.004 inch.

10. A solar cell module comprising:
    at least one solar cell;
    a transparent encapsulant material disposed adjacent at least one surface of the solar cell, the encapsulant material comprising (1) a first outer layer of ionomer, (2) an inner layer of metallocene polyethylene disposed adjacent a rear surface of the first layer, and (3) a second outer layer of ionomer disposed adjacent a rear surface of the layer of metallocene polyethylene;
    a front support layer formed of light transmitting material disposed adjacent a front surface of the encapsulant material; and
    a backskin layer disposed adjacent a rear surface of the encapsulant material.

11. The solar cell module of claim 10 wherein the at least one solar cell comprises a plurality of interconnected solar cells.

12. The solar cell module of claim 10 wherein the encapsulant material comprises a first encapsulant layer disposed adjacent a front surface of the solar cell and a second encapsulant layer disposed adjacent a rear surface of the solar cell.

13. The solar cell module of claim 10 wherein the solar cell is formed of copper indium diselenide.

14. The solar cell module of claim 10 wherein the solar cell is formed of amorphous silicon.

15. The solar cell module of claim 10 wherein the solar cell is formed of cadmium telluride.

16. A method of manufacturing an encapsulant material comprising:
    providing a sheet of metallocene polyethylene;
    placing a first layer of ionomer adjacent a front surface of the sheet of metallocene polyethylene; and
    placing a second layer of ionomer adjacent a rear surface of the sheet of metallocene polyethylene, wherein each of the first layer of ionomer and the second layer of ionomer have at least 4% free acid content by weight.

17. The method of claim 16 further comprising bonding the first layer of ionomer to the front surface of the sheet of metallocene polyethylene and comprising bonding the second layer of ionomer to the rear surface of the sheet of metallocene polyethylene.

18. The method of claim 16 wherein the sheet of metallocene polyethylene comprises a first layer of metallocene polyethylene and a second layer of metallocene polyethylene.

19. The method of claim 18 further comprising bonding the first layer of ionomer and the first layer of metallocene polyethylene and bonding the second layer of ionomer and the second layer of metallocene polyethylene.

20. The method claim 18 further comprising bonding the first layer of metallocene polyethylene to the second layer of metallocene polyethylene.

21. A method of manufacturing a solar cell module comprising:
    providing at least one solar cell;
    forming a transparent encapsulant material of: (1) a first layer of ionomer, (2) a layer of metallocene polyethylene disposed adjacent a rear surface of the first layer, and (3) a second layer of ionomer disposed adjacent a rear surface of the layer of metallocene polyethylene;
    placing the encapsulant material adjacent at least one surface of the solar cell; and
    positioning the solar cell and the encapsulant material between a transparent front support layer and a backskin layer.

* * * * *